United States Patent [19]
Yamamoto

[11] Patent Number: 6,057,730
[45] Date of Patent: May 2, 2000

[54] DIGITAL DEMODULATOR

[75] Inventor: Takeshi Yamamoto, Tokyo, Japan

[73] Assignee: NEC Corporation, Japan

[21] Appl. No.: 09/081,313

[22] Filed: May 19, 1998

[30]      Foreign Application Priority Data

May 20, 1997 [JP]  Japan ..................................... 9-129445

[51] Int. Cl.$^7$ .............................. H04L 27/14; H03D 3/18
[52] U.S. Cl. .......................... 329/304; 375/326; 375/327; 375/328; 375/355
[58] Field of Search ................................... 375/326, 327, 375/324, 376, 355; 329/306, 307, 304

[56]            References Cited

FOREIGN PATENT DOCUMENTS

| 3-155237 | 7/1991 | Japan . |
| 5-110612 | 4/1993 | Japan . |
| 6-232933 | 8/1994 | Japan . |
| 6-284159 | 10/1994 | Japan . |
| 7-30600 | 1/1995 | Japan . |
| 8-107432 | 4/1996 | Japan . |

OTHER PUBLICATIONS

Japanese Office Action issued Jun. 23, 1999 in a related application and English–translation of the relevant portions.

*Primary Examiner*—Arnold Kinkead
*Attorney, Agent, or Firm*—Ostrolenk, Faber, Gerb & Soffen, LLP

[57]            ABSTRACT

A clock recovery circuit includes an A/D converter and samples sampled signals from a received signal of a modulation rate depending on a sampling clock signal with a frequency twice the predetermined modulation rate. An amplitude detector detects an amplitude of a first sampled signal and an amplitude of a second sampled signal following the first samples signal. By comparing the amplitudes of the first and second sampled signals, a smaller one of the first and second sampled signals is selected. A phase of the sampling clock signal is controlled so that the amplitude of the smaller signal is minimized.

12 Claims, 3 Drawing Sheets

$|S_1| < |S_2|$ $S_1 = (S_{RE1}, S_{IM1})$  $S_2 = (S_{RE2}, S_{IM2})$ $|S_1| < |S_2|$ $|S_1| > |S_2|$

DIGITAL DEMODULATOR

BACKGROUND OF THE INVENTION

1. Field of the Invention

The present invention generally relates to a digital demodulation technique for burst signals according to a digital modulation scheme in a wireless digital communications system, and in particular to a timing clock recovery circuit and method thereof.

2. Description of the Related Art

In digital demodulation for burst signals, it is necessary to perform clock synchronization using a preamble of each burst signal. An example of such a digital demodulator for burst signals has been described in Japanese Patent Unexamined Publication No. 5-110612.

The conventional digital demodulator is provided with a quasi-sync quadrature detector which detects the real part and imaginary part of a complex-modulation baseband signal from a received radio signal. Hereinafter, the real part and the imaginary part are called real signal $S_{RE}$ and imaginary signal $S_{IM}$, respectively.

The real signal $S_{RE}$ and the imaginary signal $S_{IM}$ are respectively converted into digital form by analog-to-digital (A/D) converters depending on a sampling clock signal which is generated by a timing clock recovery circuit. The digital real signal $S_{RE}$ and the digital imaginary signal $S_{IM}$ are complex-multiplied by recovered carriers to produce I-channel demodulated signal and a Q-channel demodulated signal, respectively.

The timing clock recovery circuit is provided with a clock phase error detector and a voltage-controlled oscillator (VCO) for burst clock recovery. The clock phase error detector detects a clock phase error from the I-channel demodulated signal and the Q-channel demodulated signal. Based on the clock phase error, the sampling clock signal is generated and output to the A/D converters by the VCO for burst clock recovery, so that the clock phase error is compensated for.

In the case of mobile communications, as described before, since radio channel characteristics frequently vary, it is necessary to transmit the preamble signal for each burst transmission to compensate for variations in a radio propagation characteristic. Especially when the sync operation is started at the beginning of the burst signal, there may be a large clock phase error between the recovered timing clock signal and the clock component of the received burst signal. In this case, a long preamble causes rapid synchronization but reduced throughput of the communications system.

SUMMARY OF THE INVENTION

An object of the present invention is to provide a timing clock recovery circuit and method which can generate a high-speed timing clock from a received burst signal without reducing transmission efficiency.

Another object of the present invention is to provide a demodulator which can perform precise demodulation of a received burst signal by employing the timing clock recovery circuit and method.

According to the present invention, a clock recovery circuit is comprised of a sampler for sampling sampled signals from a received signal of a predetermined modulation rate depending on a sampling clock signal and a clock generator for generating the sampling clock signal with a frequency twice the predetermined modulation rate. An amplitude detector detects an amplitude of a first sampled signal and an amplitude of a second sampled signal following the first sampled signal. By comparing the amplitudes of the first and second sampled signals, a selector selects a smaller one of the first and second sampled signals. A clock phase controller controls a phase of the sampling clock signal so that the amplitude of the smaller one is minimized.

According to the present invention, a demodulator for demodulating a received signal including symbol components wherein each symbol has a predetermined duration is comprised of a sampler for sampling sampled signals from the received signal depending on a sampling clock signal and a clock generator for generating the sampling clock signal with a period which is a half the predetermined duration. An amplitude detector detects an amplitude of a first sampled signal and an amplitude of a second sampled signal following the first sampled signal. A determiner determines a smaller one and a larger one of the first and second sampled signals by comparing the amplitudes of the first and second sampled signals. A clock phase controller controls a phase of the sampling clock signal so that the amplitude of the smaller one is minimized. A carrier recovery circuit produces a carrier from a demodulated signal and a multiplier multiplies the larger one by the carrier to produce the demodulated signal when the amplitude of the smaller one is minimized.

Since the first and second sampled signals are sampled at twice the predetermined modulation rate and the phase of the sampling clock signal is controlled so that the amplitude of the smaller one is minimized, the time required for clock synchronization can be reduced to a half or less, compared with the prior art. Therefore, the length of a preamble of each burst signal can be reduced to a half or less, resulting in improved information transmission performance.

DETAILED DESCRIPTION OF THE PREFERRED EMBODIMENT

Figure 1:
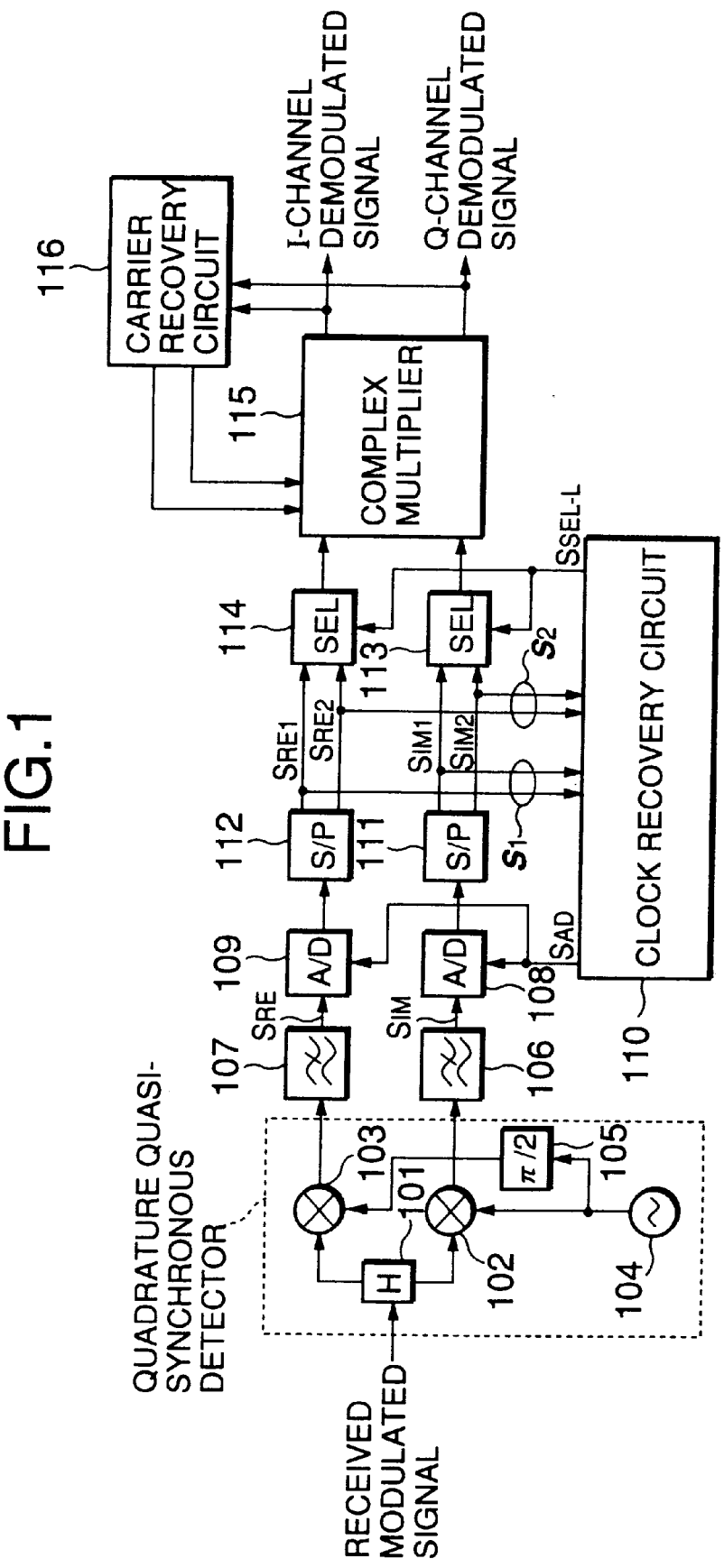
FIG. 1 is a block diagram showing the functional configuration of a demodulator according to an embodiment of the present invention.

Referring to FIG. 1, a digital demodulator is provided with a quadrature quasi sync detector which receives a radio PSK (phase-shift keying) signal to produce a complex-modulation signal. More specifically, the quadrature quasi-sync detector includes a splitter 101 by which the received PSK signal is split into two PSK signals. The respective PSK signals are output to multipliers 102 and 103. The multiplier 102 multiplies the PSK signal by a local frequency signal generated by a local oscillator 104. On the other hand, the multiplier 103 multiplies the PSK signal by a π/2-phase shifted local frequency signal received from a π/2-phase shifter 105 which shifts the phase of the local frequency signal by π/2.

The respective outputs of the multipliers 102 and 103 pass through bandpass filters 106 and 107 to A/D converters 108 and 109, respectively. As described before, the real part and the imaginary part of the complex-modulation baseband signal passing through the bandpass filters 108 and 109 are called real signal $S_{RE}$ and imaginary signal $S_{IM}$, respectively.

The A/D converters 108 and 109 convert the real signal $S_{RE}$ and the imaginary signal $S_{IM}$ into digital form depending on a sampling clock signal $S_{AD}$. The frequency of the sampling clock signal $S_{AD}$ is twice as high as the modulation rate of the complex-modulation baseband signal. In other words, the complex-modulation baseband signal is sampled by the sampling clock signal $S_{AD}$ twice in a symbol period.

The digital real signal $S_{RE}$ and the digital imaginary signal $S_{IM}$ are output to serial-to-parallel (S/P) converters 111 and 112. The S/P converter 111 converts the serial imaginary signal $S_{IM}$ to a parallel imaginary signal consisting of a first imaginary signal $S_{IM1}$ which was earlier sampled and a second imaginary signal $S_{IM2}$ which was later sampled. The S/P converter 112 converts the serial real signal $S_{RE}$ to a parallel real signal consisting of a first real signal $S_{RE1}$ which was earlier sampled and a second real signal $S_{RE2}$ which was later sampled. The first real signal $S_{RE1}$ and the first imaginary signal $S_{IM1}$ are output as a first vector $S_1$ to the timing clock recovery circuit 110. The second real signal $S_{RE2}$ and the second imaginary signal $S_{IM2}$ are output as a second vector $S_2$ to the timing clock recovery circuit 110.

Further, the first imaginary signal $S_{IM1}$ and the second imaginary signal $S_{IM2}$ are output to a selector 113. The first real signal $S_{RE1}$ and the second real signal $S_{RE2}$ are output to a selector 114. The selectors 113 and 114 each perform selection of input signals depending on a larger-selection signal $S_{SEL-L}$ received from the timing clock recovery circuit 110. More specifically, the selector 113 selects a larger one from the first imaginary signal $S_{IM1}$ and the second imaginary signal $S_{IM2}$ depending on the larger-selection signal $S_{SEL-L}$. At the same time, the selector 114 selects a larger one from the first real signal $S_{RE1}$ and the second real signal $S_{RE2}$ depending on the larger-selection signal $S_{SEL-L}$.

The selected imaginary signal and the selected real signal are output to a complex multiplier 115 which multiples them by recovered carriers generated by a carrier recovery circuit 116 to produce I-channel demodulated signal and Q-channel demodulated signal.

AS described above, the timing clock recovery circuit 110 generates the sampling clock signal $S_{An}$ and the larger-selection signal $S_{SEL-L}$ from the first vector $S_1=(S_{RE1}, S_{IM1})$ and the second vector $S_2=(S_{RE2}, S_{IM2})$. The details will be described hereinafter.

Figure 2:
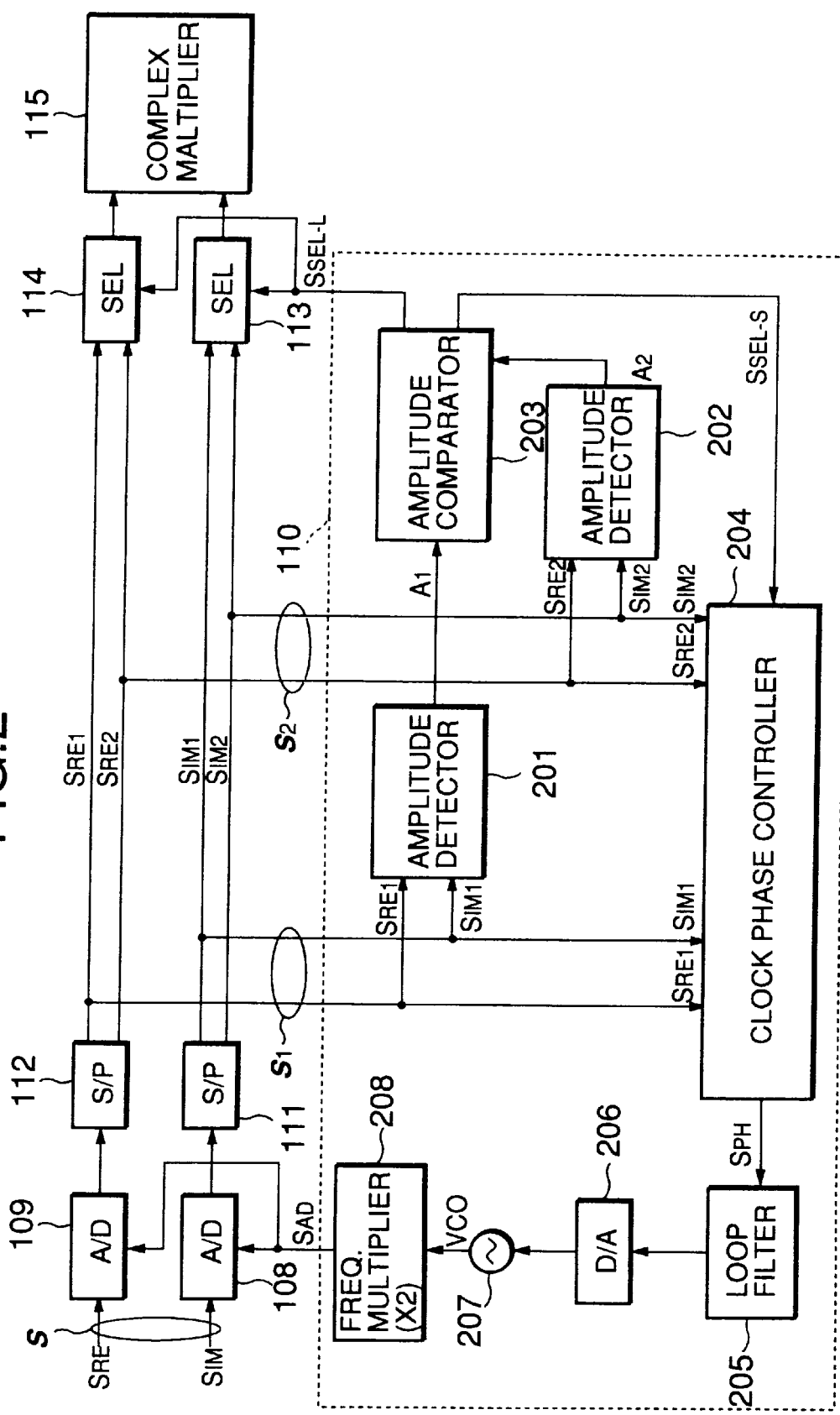
FIG. 2 is a block diagram showing the functional configuration of a timing clock recovery circuit of the embodiment as shown in FIG. 1.

Referring to FIG. 2, the timing clock recovery circuit 110 is provided with first and second amplitude detectors 201 and 202 which detects amplitudes $A_1$ and $A_2$ from the first vector $S_1=(S_{RE1}, S_{IM1})$ and the second vector $S_2=(S_{RE2}, S_{IM2})$, respectively. More specifically, the first amplitude detector 201 calculates the amplitude $A_1$ by the equation: $|S_1|=(S_{RE1}^2+S_{IM1}^2)^{1/2}$. Similarly, the second amplitude deflector 202 calculates the amplitude $A_2$ by the equation: $|S_2|=(S_{RE2}^1+S_{IM2}^2)^{1/2}$. When receiving the first and second amplitudes $A_1$ and $A_2$. an amplitude comparator 203 compares them to produce the larger-selection signal $S_{SEL-L}$ and a smaller-selection signal $S_{SEL-S}$.

The smaller-selection signal $S_{SEL-S}$ is output to a clock phase controller 204 which produces a phase error signal $S_{PH}$ based on a smaller vector selected from the first vector $S_1=(S_{RE1}, S_{IM1})$ and the second vector $S_2=(S_{RE2}, S_{IM2})$ depending on the smaller-selection signal $S_{SEL-S}$. The phase error signal $S_{PH}$ is output to a loop filter 205 and is then converted by a digital-to-analog (D/A) converter 206 into analog form. The D/A converter 206 outputs the analog phase error signal as a frequency control signal to a VCO 207. The VCO 207 generates an oscillation signal of the modulation rate depending on the analog phase error signal.

The frequency of the oscillation signal is doubled by a frequency multiplier 208 to produce the sampling clock signal $S_{AD}$. In other words, the period of the sampling clock signal $S_{AD}$ is a half the symbol period T.

The clock phase controller 204 controls the phase of the sampling clock signal $S_{AD}$ so as to minimize the amplitude of the selected smaller vector. As will be described hereinafter, when the amplitude of the selected smaller vector is minimized, the other larger vector indicates the optimal sampled complex-modulation baseband signal. The clock phase controller 204 performing such a phase control may be implemented with read-only memory (ROM).

Figure 3A:
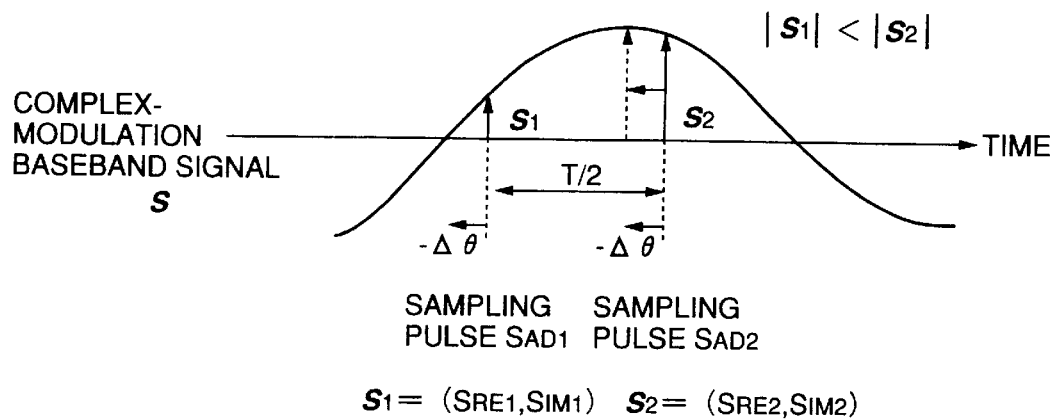
FIGS. 3A–3C are a diagram showing the waveform of the complex-modulation baseband signal for explanation of operations of the timing clock recovery circuit.

As shown in FIG. 3A, it is assumed for simplicity that the first vector $S_1$ and the second vector $S_2$ are sampled from the complex modulation baseband signal S at sampling pulses $S_{AD1}$ and $S_{AD2}$, respectively, and the sampled vectors $S_1$ and $S_2$ are in the same direction.

Since the amplitude of the first vector $S_1$ is smaller than that of the second vector $S_2$ in this case, the clock phase controller 204 selects the first vector $S_1$ and controls the phase error signal $S_{PH}$ so that the amplitude of the first vector $S_1$ is minimized. In FIG. 3A, the sampling clock signal $S_{AD}$ is phase shifted by $-\Delta\ \theta$, resulting in the minimized amplitude of the first vector $S_1$. When the amplitude of the first vector $S_1$ is minimized, the second vector $S_2$ is sampled at the optimal sampling instant and thereby the maximized amplitude of the second vector $S_2$ is obtained.

Figure 3B:
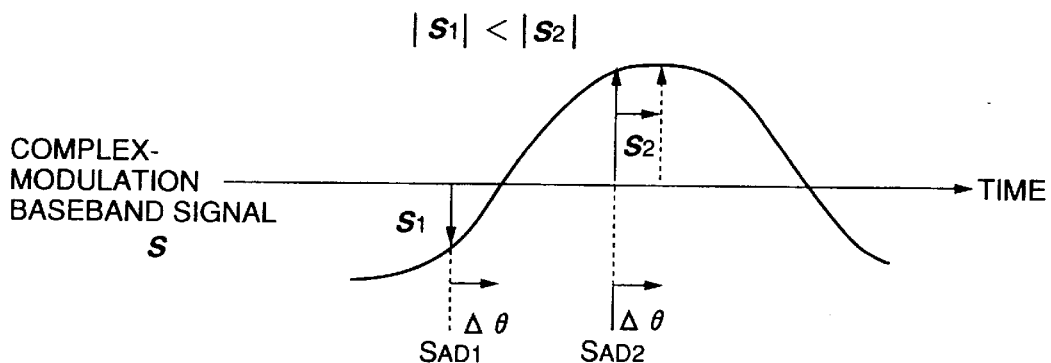

As shown in FIG. 3B, it is assumed that the first vector $S_1$ and the second vector $S_2$ are sampled from the complex-modulation baseband signal S at sampling pulses $S_{AD1}$ and $S_{AD2}$, respectively, and the sampled vectors $S_1$ and $S_2$ are in opposite directions.

Since the amplitude of the first vector $S_1$ is smaller than that of the second vector $S_2$ in this case, the clock phase controller 204 selects the first vector $S_1$ and controls the phase error signal $S_{PH}$ so that the amplitude of the first vector $S_1$ is minimized. In FIG. 3B, the sampling clock signal $S_{AD}$ is phase shifted by $\Delta\ \theta$, resulting in the minimized amplitude of the first vector $S_1$. When the amplitude of the first vector $S_1$ is minimized, the second vector $S_2$ is sampled at the optimal sampling instant and thereby the maximized amplitude of the second vector $S_2$ is obtained.

Figure 3C:
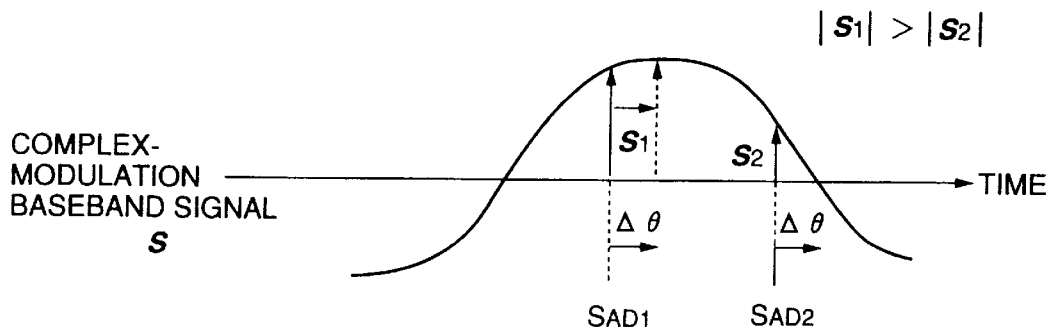

As shown in FIG. 3C, it is assumed that the first vector $S_1$ and the second vector $S_2$ are sampled from the complex modulation baseband signal S at sampling pulses $S_{AD1}$ and $S_{AD2}$, respectively, and the sampled vectors $S_1$ and $S_2$ are in the same direction but the amplitude of the first vector $S_1$ is larger than that of the second vector $S_2$.

In this case, the clock phase controller 204 selects the second vector $S_2$ and controls the phase error signal $S_{PH}$ so that the amplitude of the second vector $S_2$ is minimized. In FIG. 3C, the sampling clock signal $S_{AD}$ is phase shifted by $\Delta\ \theta$, resulting in the minimized amplitude of the second vector $S_2$. When the amplitude of the second vector $S_2$ is minimized, the first vector $S_1$ is sampled at the optimal sampling instant and thereby the maximized amplitude of the first vector $S_1$ is obtained.

In the above manner, the optimally sampled vector is obtained. Since the selectors 113 and 114 select the larger vector, that is, the second vector $S_2$ of FIGS. 3A and 3B and the first vector $S_1$ of FIG. 3C, the optimally sampled vector is output to the complex multiplier 115.

Therefore, compared with the prior art, the control range of clock phase shift is halved. More specifically, in the case where a clock phase error ranging from $-\pi/2$ to $\pi/2$ occurs between the recovered timing clock signal and the clock component of the received burst signal when the sync operation is started at the beginning of the burst signal, the clock phase is shifted so that the phase difference becomes zero. On the other hand, in the case where a clock phase error ranging from $-\pi$ to $-\pi/2$ or from $\pi/2$ to $\pi$ occurs, the clock phase is shifted so that the phase difference becomes $-\pi$ or $\pi$.

In other words, the first vector $S_1$ and the second vector $S_2$ are sampled from the complex-modulation baseband signal S at two sampling pulses $S_{AD1}$ and $S_{AD2}$ for a symbol duration, respectively, and a smaller one of them is used to search for the optimal sampling instant. Therefore, the amount of clock phase shift is at the maximum a quarter the symbol duration.

It should be noted that the clock recovery circuit 110 can be used together with a differential detection system because it can operate independently of the carrier recovery circuit 116.

What is claimed is:

1. A clock recovery circuit comprising:
   a sampling circuit which samples signals from a received signal of a predetermined modulation rate depending on a sampling clock signal thereby producing sampled signals;
   a clock generator which generates said sampling clock signal with a frequency twice said predetermined modulation rate;
   an amplitude detector which detects from said sampled signals, an amplitude of a first sampled signal and an amplitude of a second sampled signal following said first sampled signal;
   a selector which selects a smaller signal of said first and second sampled signals by comparing amplitudes of said first and second sampled signals; and
   a clock phase controller which controls a phase of said sampling clock signal so that the amplitude of said smaller signal is minimized.

2. The clock recovery circuit according to claim 1, wherein said amplitude detector comprises:
   a serial-to-parallel converter which converts said sampled signals from serial to parallel to produce said first and second sampled signals;
   a first amplitude detector which detects the amplitude of said first sampled signal; and
   a second amplitude detector which detects the amplitude of said second sampled signal.

3. The clock recovery circuit according to claim 1, wherein said clock generator comprises:
   a voltage-controlled oscillator which generates a clock signal with a frequency equal to said predetermined modulation rate under control of said clock phase controller; and
   a frequency multiplier which produces said sampling clock signal.

4. A demodulator for demodulating a received signal including symbol components wherein each symbol has a predetermined duration, said demodulator comprising:
   a sampling circuit which samples signals from said received signal depending on a sampling clock signal thereby producing sampled signals;
   a clock generator which generates said sampling clock signal with a period which is a half said predetermined duration;
   an amplitude detector which detects, from said sampled signals, an amplitude of a first sampled signal and an amplitude of a second sampled signal following said first sampled signal;
   a determiner which determines a smaller signal and a larger signal of said first and second sampled signals by comparing the amplitudes of said first and second sampled signals;
   a clock phase controller which controls a phase of said sampling clock signal so that the amplitude of said smaller signal is minimized;
   a carrier recovery circuit which produces a carrier from the demodulated signal; and
   a multiplier which multiplies said larger signal by said carrier to produce said demodulated signal when the amplitude of said smaller signal is minimized.

5. The demodulator according to claim 4, wherein said amplitude detector comprises:
   a serial-to-parallel converter which converts said sampled signals from serial to parallel to produce said first and second sampled signals;
   a first amplitude detector which detects the amplitude of said first sampled signal; and
   a second amplitude detector which detects the amplitude of said second sampled signal.

6. The demodulator according to claim 4, wherein said clock generator comprises;
   a voltage-controlled oscillator which generates a clock signal with a period equal to said predetermined duration under control of said clock phase controller; and
   a frequency multiplier which produces said sampling clock signal.

7. A burst signal demodulator for demodulating a received burst signal modulated according to digital quadrature modulation of a predetermined modulation rate, said demodulator comprising:
   a quadrature quasi-synchronous detector which detects from said received burst signal, a complex-modulation baseband signal including a real signal and an imaginary signal;
   first and second analog-to-digital converters which sample said real and imaginary signals, depending on a sampling clock signal, to produce digital real and imaginary signals, respectively;
   a clock generator which generates said sampling clock signal with a frequency twice that of said predetermined modulation rate;
   first and second converters which convert said digital real and imaginary signals from serial to parallel, respectively, to produce a first digital signal and a second digital signal, wherein said first digital signal is followed by said second digital signal and said first digital signal includes a first digital real signal and a first digital imaginary signal and said second digital signal includes a second digital real signal and a second digital imaginary signal;
   first and second amplitude detectors which detect an amplitude of said first digital signal and an amplitude of said second digital signal;
   a determiner which determines a smaller signal and a larger signal of said first and second digital signals by comparing the amplitudes of said first and second digital signals;
   a clock phase controller which controls a phase of said sampling clock signal so that the amplitude of said smaller signal is minimized;

a carrier recovery circuit which produces a quadrature carrier from a quadrature-demodulated signal; and a complex multiplier which multiplies said larger signal by said quadrature carrier to produce said quadrature-demodulated signal when the amplitude of said smaller signal is minimized.

8. The burst signal demodulator according to claim 7, wherein said clock generator comprises:

a voltage-controlled oscillator which generates a clock signal with a frequency of said predetermined modulation rate under control of said clock phase controller; and a frequency multiplier which produces said sampling clock signal.

9. A method of recovering a clock signal, said method comprising:

sampling signals from a received signal of a predetermined modulation rate, said sampling depending on a sampling clock signal and producing sampled signals;

generating said sampling clock signal with a frequency twice that of said predetermined modulation rate;

detecting an amplitude of a first sampled signal and an amplitude of a second sampled signal following said first sampled signal, said detecting being performed on said sampled signals;

selecting a smaller signal of said first and second sampled signals by comparing the amplitudes of said first and second sampled signals; and controlling a phase of said sampling clock signal so that the amplitude of said smaller signal is minimized.

10. The method according to claim 9, wherein said generating comprises:

generating a clock signal with a frequency equal to said predetermined modulation rate base on said controlling; and doubling said clock signal to produce said sampling clock signal.

11. A method for demodulating a received signal including symbol components wherein each symbol component has a predetermined duration, said method comprising:

sampling said received signal based upon a sampling clock signal thereby producing sampled signals;

generating said sampling clock signal with a period that is half said predetermined duration;

detecting an amplitude of a first sampled signal and an amplitude of a second sampled signal following said first sampled signal, said detecting being performed on said sampled signals;

determining a smaller signal and a larger signal of said first and second sampled signals by comparing the amplitudes of said first and second sampled signals;

controlling a phase of said sampling clock signal so that the amplitude of said smaller signal is minimized;

producing a carrier from a demodulated signal; and multiplying said larger signal by said carrier to produce said demodulated signal when the amplitude of said smaller signal is minimized.

12. A method for demodulating a received burst signal modulated according to digital quadrature modulation of a predetermined modulation rate, said method comprising:

detecting a complex-modulation baseband signal including a real signal and an imaginary signal from said received burst signal according to quadrature quasi-synchronous detection;

sampling said real and imaginary signals depending on a sampling clock signal to produce digital real and imaginary signals;

generating said sampling clock signal with a frequency twice that of said predetermined modulation rate;

converting said digital real and imaginary signals from serial to parallel to produce a first digital signal and a second digital signal, wherein said first digital signal is followed by said second digital signal and said first digital signal includes a first digital real signal and a first digital imaginary signal and said second digital signal includes a second digital real signal and a second digital imaginary signal;

detecting an amplitude of said first digital signal and an amplitude of said second digital signal;

determining a smaller signal and a larger signal of said first and second digital signals by comparing the amplitudes of said first and second digital signals;

controlling a phase of said sampling clock signal so that the amplitude of said smaller signal is minimized;

producing a quadrature carrier from a quadrature-demodulated signal; and multiplying said larger signal by said quadrature carrier to produce said quadrature-demodulated signal when the amplitude of said smaller signal is minimized.

* * * * *